United States Patent
Sudo et al.

(10) Patent No.: US 9,797,063 B2
(45) Date of Patent: Oct. 24, 2017

(54) VITREOUS SILICA CRUCIBLE

(75) Inventors: Toshiaki Sudo, Akita (JP); Hiroshi Kishi, Akita (JP); Eriko Suzuki, Akita (JP)

(73) Assignee: SUMCO CORPORATION, Tokyo (JP)

(*) Notice: Subject to any disclaimer, the term of this patent is extended or adjusted under 35 U.S.C. 154(b) by 890 days.

(21) Appl. No.: 13/307,253

(22) Filed: Nov. 30, 2011

(65) Prior Publication Data

US 2012/0132133 A1    May 31, 2012

(30) Foreign Application Priority Data

Nov. 30, 2010 (JP) ................. 2010-267590

(51) Int. Cl.
  *C30B 15/10*  (2006.01)
  *C03B 19/09*  (2006.01)

(52) U.S. Cl.
  CPC ............ *C30B 15/10* (2013.01); *C03B 19/095* (2013.01); *Y10T 117/1032* (2015.01)

(58) Field of Classification Search
  CPC .. C30B 15/10; C03B 19/095; Y10T 117/1032
  See application file for complete search history.

(56) References Cited

U.S. PATENT DOCUMENTS

| | | | |
|---|---|---|---|
| 5,410,428 A * | 4/1995 | Yamagata et al. | 359/350 |
| 6,652,934 B1 | 11/2003 | Miyao et al. | |
| 8,286,447 B2 * | 10/2012 | Kishi et al. | 65/17.3 |
| 2006/0183623 A1 * | 8/2006 | Ikuta et al. | 501/54 |
| 2009/0084308 A1 | 4/2009 | Kishi et al. | |
| 2010/0000465 A1 * | 1/2010 | Kishi et al. | 117/208 |
| 2010/0132609 A1 * | 6/2010 | Ohama | 117/208 |
| 2010/0229599 A1 * | 9/2010 | Fujita | C30B 15/10 65/33.9 |
| 2010/0234205 A1 * | 9/2010 | Ikuta et al. | 501/53 |
| 2012/0017824 A1 * | 1/2012 | Sudo et al. | 117/13 |
| 2012/0137964 A1 * | 6/2012 | Sudo et al. | 117/208 |
| 2012/0141704 A1 * | 6/2012 | Sudo et al. | 428/34.5 |
| 2014/0041575 A1 * | 2/2014 | Yamagata | C30B 35/002 117/208 |

FOREIGN PATENT DOCUMENTS

| | | | |
|---|---|---|---|
| JP | 2000-247778 A | | 9/2000 |
| JP | 2004-292210 A | | 10/2004 |
| JP | 2006-089301 A | | 4/2006 |
| JP | 2013112597 A | * | 6/2013 |

OTHER PUBLICATIONS

Extended European Search Report dated Jul. 19, 2012, issued in corresponding Application No. EP 11191115.2.

* cited by examiner

*Primary Examiner* — Anita Alanko
(74) *Attorney, Agent, or Firm* — Law Office of Katsuhiro Arai

(57) ABSTRACT

The present invention provides a vitreous silica crucible which can suppress buckling and sidewall lowering of the crucible without fear of mixing of impurities into silicon melt. According to the present invention, provided is a vitreous silica crucible for pulling a silicon single crystal, wherein a ratio I2/I1 is 0.67 to 1.17, where I1 and I2 are area intensities of the peaks at 492 $cm^{-1}$ and 606 $cm^{-1}$, respectively, in Raman spectrum of vitreous silica of the region having a thickness of 2 mm from an outer surface to an inner surface of a wall of the crucible.

4 Claims, 1 Drawing Sheet

Enlarged View of Region A

US 9,797,063 B2

VITREOUS SILICA CRUCIBLE

CROSS-REFERENCE TO RELATED APPLICATION

This application is related to Japanese Patent Application No. 2010-267590 filed on Nov. 30, 2010, whose priority is claimed and the disclosure of which is incorporated by reference in its entirety.

BACKGROUND OF THE INVENTION

1. Field of the Invention

The present invention relates to a vitreous silica crucible.

2. Description of the Related Art

In general, silicon single crystal is manufactured by melting high-purity polycrystalline silicon in a vitreous silica crucible to obtain silicon melt, dipping an end of a seed crystal to the silicon melt, and pulling the seed crystal while rotating it.

The melting point of silicon is 1410 deg. C., and thus the temperature of silicon melt is kept at a temperature equal to or higher than 1410 deg. C. At such temperature, a vitreous silica crucible reacts with silicon melt, and the thickness of the crucible wall gradually decreases. When the thickness of the crucible wall decreases, the strength of the crucible is lowered. This leads to problems such as buckling and sidewall lowering of the crucible.

In order to solve such problem, there is known a technique to provide a layer, on the outside of the crucible, to promote crystallization. When such a layer is provided, the outer layer of the crucible is crystallized and the crucible strength is improved (e.g. JP-A-2000-247778). When such layer is provided, the outer layer of the crucible is crystallized when the crucible is heated for a long time. Crystalline silica has higher strength per unit thickness than vitreous silica. Therefore, the crystallization enhances the strength per unit thickness, and suppresses buckling or sidewall lowering of the crucible.

SUMMARY OF THE INVENTION

According to the technique of JP-A-2000-247778, the problem of the buckling and sidewall lowering can be suppressed by crystallization of the outer layer. However, because impurities are added to the outer layer, and thus the impurities can mix in the silicon melt depending on the conditions of pulling a silicon ingot. This leads to deterioration of the crystallinity of silicon single crystal.

The present invention has been made in view of these circumstances, and provides a vitreous silica crucible which can suppress buckling and sidewall lowering of the crucible without fear of mixing of impurities into silicon melt.

According to the present invention, provided is a vitreous silica crucible for pulling a silicon single crystal, wherein a ratio I2/I1 is 0.67 to 1.17, where I1 and I2 are area intensities of the peaks at 492 $cm^{-1}$ and 606 $cm^{-1}$, respectively, in Raman spectrum of vitreous silica of the region having a thickness of 2 mm from an outer surface to an inner surface of a wall of the crucible.

Raman spectrum of vitreous silica has peaks at 492 $cm^{-1}$ and 606 $cm^{-1}$. The present inventors have made research on the relationship between the area intensity ratio I2/I1 of these peaks and the easiness of crystallization of vitreous silica, and found that when the area intensity ratio I2/I1 is 0.67 to 1.17, the crystallized layer formed on the outer surface of the crucible during pulling of a silicon ingot is thickened, and thus the crucible strength is improved.

Furthermore, it has been found that the area intensity ratio can be adjusted by changing the fusing temperature or cooling profile of the process of fusing silica powder followed by cooling to form vitreous silica. Therefore, it is possible to crystallize the outer surface of the crucible without adding a mineralizing element by adjusting the area intensity ratio I2/I1 to 0.67 to 1.17 by adjusting the fusing and cooling conditions in forming vitreous silica. Therefore, it is possible to suppress buckling and sidewall lowering of the crucible without fear of mixing of impurities into silicon melt.

DESCRIPTION OF THE PREFERRED EMBODIMENTS

1. Configuration of Vitreous Silica Crucible

Figure 1:
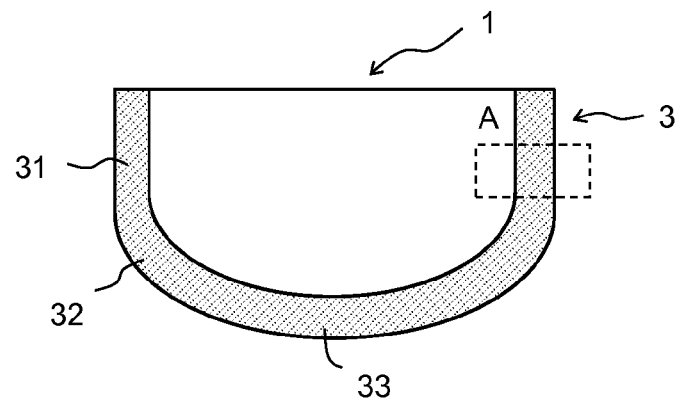
FIG. 1 is a sectional view showing a structure of vitreous silica crucible of one embodiment of the present invention.
Figure 2:
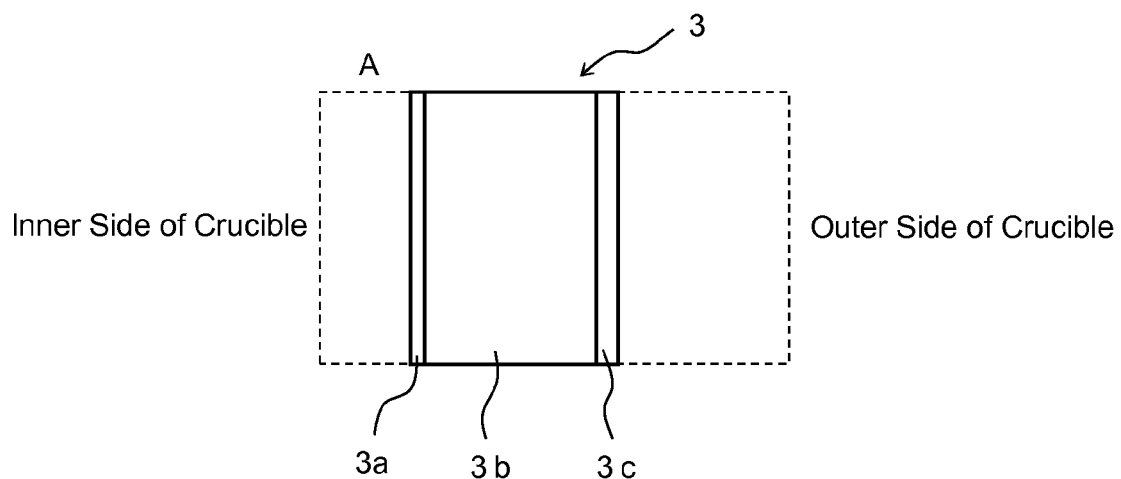
FIG. 2 is an enlarged view of region A in FIG. 1.

Hereinafter, with reference to FIGS. 1 and 2, embodiments of a vitreous silica crucible of the present invention will be explained. FIG. 1 is a sectional view showing a structure of a vitreous silica crucible of the present embodiment, and FIG. 2 is an enlarged view of the region A in the FIG. 1.

The vitreous silica crucible 1 of the present embodiment is for pulling a silicon single crystal, and the ratio I2/I1 is 0.67 to 1.17, where I1 and I2 are area intensities of the peaks at 492 $cm^{-1}$ and 606 $cm^{-1}$, respectively, in Raman spectrum of vitreous silica of the region having a thickness of 2 mm from an outer surface to an inner surface of a wall 3c of the crucible 1.

Here, the respective components are explained in detail.

As shown in the sectional view of FIG. 1, the wall 3 of vitreous silica crucible 1 has a corner portion 32, a cylindrical sidewall portion 31, and a bottom portion 33. The corner portion 32 has a relatively large curvature. The sidewall portion 31 has a rim portion having an upward opening. The bottom portion 33 is flat or has a relatively small curvature, and is mortar-shaped. In the present invention, the corner portion refers to a portion connecting the sidewall portion 31 and the bottom portion 33, and starts at a point where a line tangential to the corner portion 32 overlaps with the sidewall portion 31 and ends at a point where the corner portion 32 and the bottom portion 33 have a common tangential line. In other words, the boundary between the sidewall portion 31 and the corner portion 32 is a point where a straight portion of the wall 3 starts to curve. Furthermore, the portion with a constant curvature at the bottom of the crucible is the bottom portion 33, and as the distance from the center of the crucible increases, a point where the curvature starts to change is the boundary between the bottom portion 33 and the corner portion 32.

The area intensity ratio I2/I1 of the region 3c having a thickness of 2 mm from the outer surface needs to be 0.67 to 1.17, but the configuration of the wall 3 in the thickness direction is not in particular limited in the other aspects, and it can be single layer structure, or two-or-more layer structure. When the wall 3 is single layer structure, it can be either synthetic vitreous silica layer (hereinafter referred to as "synthetic layer") or natural vitreous silica layer (hereinafter referred to as "natural layer"). Synthetic layer is advantageous in that it is high-purity and thus mixing of impurities into silicon melt can be prevented. Natural layer is advantageous in that the high-temperature viscosity is higher than synthetic layer, and thus the high-temperature strength of the crucible can be enhanced. So, in order to obtain both of these advantages, a crucible is preferred to be configured to have a synthetic layer 3a on the inner surface side and a natural layer 3b on the outer surface side.

The region 3c which is 2 mm from the outer surface of the crucible 1 is a region for which Raman spectrum is measured. This region does not have to be distinguishable from the other region in terms of the appearance or the constitution. It can be a part of the vitreous silica layer of the outer layer. The vitreous silica in this region 3c may contain a mineralizing element. However, because the crucible of the present embodiment can be crystallized without a mineralizing element, it is preferred that the region 3c is non-doped in order to prevent contamination due to the mineralizing element. "Non-doped" used herein means that the impurity concentration is 20 ppm or less (preferably 15 ppm or less). Furthermore, it is permissible to add a mineralizing element to the region 3c in order to further promote crystallization of the region 3c. Even when the mineralizing element is added to the region 3c, the required amount of the mineralizing element can be reduced because vitreous silica in the region 3c has tendency to be easily crystallized.

The mineralizing element used herein refers to an element which promotes crystallization of vitreous silica. It can exist in vitreous silica in the form of an inorganic salt, nitrate, carbonate, sulfate, acetate, oxalate, fluoride salt, phosphate, oxide, peroxide, hydroxide, chloride, or may be substituted for Si, or in the ionized state, or in the state of a compound such as $Al_2O_3 \cdot 2SiO_2$. Examples of the mineralizing element include Na, K, Li, Ca, Sr, Ba, Ra, Ti, Zr, Cr, Mo, Fe, Co, Ni, Cu, and Ag.

The present inventors first came up with a hypothesis that the degree of distortion in vitreous silica relates to easiness of crystallization of vitreous silica, and focused on the peaks, of Raman spectrum of vitreous silica, related to planar four-membered ring structure and planar three-membered ring structure which are distortion structures of vitreous silica. Then, the present inventors have found that vitreous silica is easily crystallized when the ratio I2/I1 is 0.67 to 1.17, where I1 is an area intensity of the peak at 492 $cm^{-1}$ assigned to planar four-membered ring structure and I2 is an area intensity of the peak at 606 $cm^{-1}$ assigned to planar three-membered ring structure, and completed the present invention. The ratio I2/I1 is, for example, 0.67, 0.7, 0.75, 0.8, 0.85, 0.9, 1, 1.05, 1.10, 1.15, 1.17, and it can be in the range between two values of the values exemplified here.

The ratio I2/I1 of the region 3c can be 0.67 to 1.17 over the entire outer surface of the crucible 1. Alternatively, because it is preferred to enhance the strength at the sidewall portion 31 and the corner portion 32 of the crucible in order to prevent buckling and sidewall lowering, the ratio I2/I1 of the region 3c can be 0.67 to 1.17 only at the sidewall portion 31 or only at the sidewall portion 31 and corner portion 32.

The Raman spectrum of the region 3c which is 2 mm from the outer surface of the crucible 1 can be measured by use of a sample obtained by scraping the region 3c from the crucible 1 followed by pulverizing and stirring, or a sample obtained by cutting out the region 3c having a thickness of 2 mm from the outer surface of the crucible 1.

The synthetic layer 3a is an innermost layer of the crucible 1, and contacts silicon melt. The synthetic layer 3a is a layer made of vitreous silica obtained by fusing and solidifying chemically synthesized silica (silicon oxide) (hereinafter, such vitreous silica is referred to as "synthetic vitreous silica"), and has very low impurity concentration. Therefore, it is possible to reduce the amount of impurities mixed in silicon melt by providing the synthetic layer 3a on the inner layer of the crucible 1. The method of chemical synthesis of silica is not in particular limited, and, may be, for example, gas phase oxidation (dry synthesis) of silicon tetrachloride ($SiCl_4$), or hydrolysis (sol-gel method) of silicon alkoxide ($Si(OR)_4$).

The natural layer 3b is a layer formed of vitreous silica obtained by fusing and solidifying silica powder obtained from natural mineral whose main component is α-quartz. When α-quartz is fused, the viscosity is largely reduced. However, the chain structure of the repetition of SiO bond is not completely destroyed, and thus natural vitreous silica still contains crystalline microstructure therein, and thus natural vitreous silica is not easily deformed. Thus, the natural layer has relatively high viscosity. Furthermore, the natural layer 3b is made from a natural product, and thus inevitably includes impurities in a concentration of 20 ppm or less.

2. Method of Manufacturing Vitreous Silica Crucible

The vitreous silica crucible 1 of the present embodiment can be manufactured by (1) forming a silica powder layer by depositing crystalline or amorphous silica powder in a predetermined thickness on the bottom surface and the side surface having a bowl-shaped inner surface which defines the outer shape of the vitreous silica crucible while rotating the mold, and (2) fusing the silica powder layer by arc discharge followed by cooling.

It is preferred that the silica powder is fused in a way that the maximum attained temperature on the inner surface of the rotating mold is 2000 to 2600 deg. C. When the maximum attained temperature is below 2000 deg. C., the gas residing in the structure of vitreous silica or residing as bubble in vitreous silica is not completely removed, and thus the crucible largely expands while pulling a silicon single crystal. When the maximum attained temperature is over 2600 deg. C., the viscosity of vitreous silica decreases and deformation of the crucible occurs.

Cooling after the fusing is carried out in a way that the ratio I2/I1 becomes 0.67 to 1.17. The ratio I2/I1 varies depending on the fusing temperature and the cooling profile. In general, the ratio I2/I1 increases as the fusing temperature increases, and the ratio I2/I1 increases as the cooling rate increases. Therefore, fusing and cooling are first carried out without consideration of the ratio I2/I1, and the ratio I2/I1 is measured for the manufactured crucible. When the measure ratio I2/I1 is smaller than 0.67, the fusing temperature is increased or the cooling rate is increased in order to adjust the value of the ratio I2/I1 to 0.67 to 1.17. In contrast, when the measured ratio I2/I1 is larger than 1.17, the fusing temperature is decreased or the cooling rate is decreased in order to adjust the value of the ratio I2/I1 to 0.67 to 1.17.

A transparent layer having virtually no bubbles (i.e. bubble content of less than 0.5%) can be formed by subjecting the silica powder layer to a reduced pressure of −50 kPa or more and less than −95 kPa while fusing the silica powder layer. Furthermore, after the transparent layer is formed, a bubble-containing layer having a bubble content of 0.5% or more and less than 50% can be formed on the outer side of the transparent layer by subjecting the silica powder layer to a pressure of +10 kPa or more and less than −20 kPa. In the present specification, the bubble content rate refers to the ratio ($w_2/w_1$) of the volume ($w_2$) occupied by bubbles in a unit volume ($w_1$) of the crucible 1. In the present specification, the value of the pressure is the value with reference to the ambient air pressure.

3. Method of Manufacturing Silicon Ingot

A silicon ingot can be manufactured by the processes of (1) forming silicon melt by melting polycrystalline silicon in the vitreous silica crucible 1 of the present embodiment, and (2) dipping an end of a silicon seed crystal to the silicon melt, and pulling the seed crystal while rotating the seed crystal. The silicon single crystal has a shape having, from the upper side, a cylindrical silicon seed crystal, a cone-shaped silicon single crystal, a cylindrical silicon single crystal having the same diameter as the base of the upper cone (hereinafter, referred to as "straight body portion"), a cone-shaped silicon single crystal having a downward apex.

A silicon ingot is usually pulled at approx. 1450 to 1500 deg. C. The outer side of the crucible 1 of the present embodiment is easily crystallized, and thus when a silicon ingot is pulled by use of the crucible 1 of the present embodiment, the outer side of the crucible 1 is crystallized during pulling to enhance the strength, which results in prohibition of buckling and sidewall lowering of the crucible.

When an impurity-containing layer is provided on the outer surface of the crucible as in a conventional crucible, it is possible that the impurities mix in silicon melt, which deteriorates crystallinity of silicon ingot. However, the outer surface of the crucible of the present embodiment is easily crystallized without addition of such impurities, and thus the risk of mixing of the impurities into silicon melt can be reduced.

Example

A crucible having an outer diameter of 800 mm and a wall thickness of 15 mm was manufactured by use of the rotating mold method. The crucible was manufactured so as to have a non-doped natural vitreous silica layer having a thickness of 14 mm on the outer side and have a non-doped synthetic vitreous silica layer having a thickness of 1 mm on the inner side. As shown in Table 1, ten samples were manufactured with different maximum attained temperatures and air flow rates of air which was blown to the mold during cooling. In the manufacturing process of the crucible sample, the upper end having a width of 2 cm or more was cut out, and the cut-out portion was pulverized and stirred to obtain a sample for measurement. Alternatively, a sample for measurement was obtained by cutting out a region 3c having a thickness of 2 mm from the outer surface of the crucible. Raman spectrum was measured with respect to the sample by use of Laser Raman Spectrometer manufactured by JASCO Corporation. The ratio I2/I1 obtained from the area intensity I1 for the peak at 492 cm$^{-1}$ and the area intensity I2 for the peak at 606 cm$^{-1}$ in the obtained Raman spectrum was calculated. The obtained values are shown in Table 1. The air flow rate in Table 1 denotes the following.

Low: flow rate of 0.1 m$^3$/s
Medium: flow rate of 1 m$^3$/s
High: flow rate of 10 m$^3$/s A silicon ingot having a diameter of 300 mm was pulled by use of the manufactured crucible sample. The thickness of the crystallized layer on the outer surface of the crucible after the pulling was measured. Furthermore, crystallinity of the obtained silicon ingot was evaluated. Evaluation of the crystallinity was performed based on the single crystallization yield. The single crystallization yield was a value of (mass of the straight body portion of the silicon single crystal)/(mass of polysilicon charged in the crucible just before pulling). The results are shown in Table 1. The evaluation criteria in Table 1 are as follows:

A: single crystallization yield is 0.80 or more and less than 0.99
B: single crystallization yield is 0.70 or more and less than 0.80
C: single crystallization yield is 0.60 or more and less than 0.70
D: single crystallization yield is less than 0.60

TABLE 1

| Sample | Maximum Attained Temperature (Deg. C.) | Air Flow Rate Blown to Mold | Ratio I2/I1 | Thickness of Crystallized Layer on Outer Surface (mm) | Single Crystallization Yield |
|---|---|---|---|---|---|
| 1 | 1850 | Low | 1.35 | 0.2 | B |
| 2 | 1800 | Low | 1.09 | 1 | A |
| 3 | 1800 | Medium | 1.27 | 0.4 | B |
| 4 | 1760 | Low | 0.84 | 2 | A |
| 5 | 1760 | Medium | 0.99 | 1.4 | A |
| 6 | 1760 | High | 1.22 | 0.6 | B |
| 7 | 1730 | Low | 0.7 | 1.2 | A |
| 8 | 1730 | Medium | 0.82 | 2 | A |
| 9 | 1730 | High | 0.98 | 1.6 | A |
| 10 | 1700 | Low | 0.65 | 0.7 | B |

With reference to Table 1, the ratio I2/I1 was 0.67 to 1.17 in the samples 2, 4, 5, 7 to 9, and the thickness of the crystallized layer on the outer surface was thick. In contrast, in samples other than the samples 2, 4, 5, 7 to 9, the ratio I2/I1 was out of the range of 0.67 to 1.17, and the thickness of the crystallized layer was not thick, and thus the single crystallization yield was low.

As shown in Table 1, it has been found that there's a tendency that as the maximum attained temperature increases, the value of the ratio I2/I1 increase, and as the air flow rate decreases, the value of the ratio I2/I1 decreases. Therefore, it has been found that it is possible to adjust the value of the ratio I2/I1 to 0.67 to 1.17 by changing the maximum attained temperature and the air flow rate of the air blown to the mold.

In sum, it has been found out that it is possible to manufacture a crucible whose outer surface is easily crystallized by adjusting the ratio I2/I1 to 0.67 to 1.17, where I1 and I2 are area intensities of the peaks at 492 cm$^{-1}$ and 606 cm$^{-1}$, respectively, in the region having a thickness of 2 mm from an outer surface of the crucible.

What is claimed is:

1. A vitreous silica crucible for pulling a silicon single crystal, wherein a ratio of the presence of planar three-member ring structure to the presence of planar four-member ring structure in the vitreous silica crucible is specified as a ratio I2/I1 which is 0.67 to 1.17, where I1 and I2 are area intensities of peaks at 492 cm$^{-1}$ and 606 cm$^{-1}$, respectively, in Raman spectrum of vitreous silica of a region having a thickness of 2 mm from an outer surface to an inner surface of a wall of the crucible.

2. The crucible of claim 1, wherein the vitreous silica of the region contains a mineralizing element in an amount of 20 ppm or less.

3. The crucible of claim 2, wherein the vitreous silica of the region contains inevitably included impurities.

4. The crucible of claim 1, wherein the ratio I2/I1 of the region is 0.67 to 1.17 only at a sidewall portion or only at a sidewall portion and corner portion of the crucible.

* * * * *